US008024597B2

(12) United States Patent
Adar et al.

(10) Patent No.: US 8,024,597 B2
(45) Date of Patent: Sep. 20, 2011

(54) SIGNAL PHASE VERIFICATION FOR SYSTEMS INCORPORATING TWO SYNCHRONOUS CLOCK DOMAINS

(75) Inventors: Etai Adar, Yokne'am (IL); Ilya Granovsky, Haifa (IL); Efrat Greenberg, Nahariya (IL); Itay Poleg, Karmiel (IL)

(73) Assignee: International Business Machines Corporation, Armonk, NY (US)

( * ) Notice: Subject to any disclaimer, the term of this patent is extended or adjusted under 35 U.S.C. 154(b) by 773 days.

(21) Appl. No.: 12/034,896

(22) Filed: Feb. 21, 2008

(65) Prior Publication Data

US 2009/0217075 A1  Aug. 27, 2009

(51) Int. Cl.
*G06F 1/04* (2006.01)
(52) U.S. Cl. ......... 713/500; 713/501; 713/502; 713/600
(58) Field of Classification Search .............. 713/400, 713/500, 501, 502, 600
See application file for complete search history.

(56) References Cited

U.S. PATENT DOCUMENTS

| 5,448,715 A * | 9/1995 | Lelm et al. ............. 713/600 |
| 5,535,377 A | 7/1996 | Parks |
| 6,425,088 B1 * | 7/2002 | Yasukawa et al. .......... 713/400 |
| 7,096,375 B2 * | 8/2006 | Wakayama et al. ......... 713/400 |
| 7,243,322 B1 | 7/2007 | Ly et al. |
| 2006/0150043 A1 | 7/2006 | Sarwary et al. |
| 2007/0130492 A1 | 6/2007 | Jamkhandi |
| 2008/0244299 A1 * | 10/2008 | Tune et al. ............. 713/401 |

OTHER PUBLICATIONS

Smrcka et al., "Verifying VHDL Designs with Multiple Clocks in SMV", 2007, <http://www.fit.vutbr.cz/smrcka/pub/fmics06.pdf>.
Feng et al., "Clock Domain Crossing Fult Model and Coverage Metric for Validation of SoC Design", 2007, <http://delivery.acm.org/10.1145/1270000/1266668/p1385-feng.pdf?key1=1266668&key2=9260625811&coll=ACM&dl+ACM&CFID+15151515&CFTOKEN+6184618>.
0-In Clock-Domain Crossing (CDC), <http://www.mentor.com/products/fv/abv/0-in-cdc/>; <http://www.mentor.com/products/fv/news/cdc_solution_for_sun.cfm>.

* cited by examiner

*Primary Examiner* — Nitin C Patel
(74) *Attorney, Agent, or Firm* — Suzanne Erez (57) ABSTRACT

The present invention implements a mechanism which enables zero-delay verification tools to detect clock domain crossing violations in device under test designs comprising two different clock domains where the fast clock rate is an integer multiple of the slow clock rate by inserting undefined (i.e., invalid) values on slow clock domain signals during the clock periods when the signals are not supposed to be captured. The undefined values are contained in the logic cone and emulate timing uncertainty of the path. Propagation of the undefined values through the capturing latch indicates improper clock domains crossing handling.

20 Claims, 8 Drawing Sheets

SIGNAL PHASE VERIFICATION FOR SYSTEMS INCORPORATING TWO SYNCHRONOUS CLOCK DOMAINS

SUMMARY

The present invention relates to the field of signal phase verification for a device under test, and more particularly relates to a method and computer program product for validating proper signal transfers and detecting clock domain crossing violations between two different synchronous clock domains, using common zero-delay verification tools.

Contemporary hardware designs utilize Double Data Rate (DDR) data transfer techniques to achieve higher bandwidth. These designs use the rising edge of a base clock to synchronize all the control logic and use both the rising and falling edges of the clock to launch the data. Alternatively, DDR application clocking may be viewed as if the design uses two synchronous clocks, with the fast clock driving the data path and the slow clock (in this case a half-rate clock, derived from the fast clock) driving the control logic.

Figure 1:
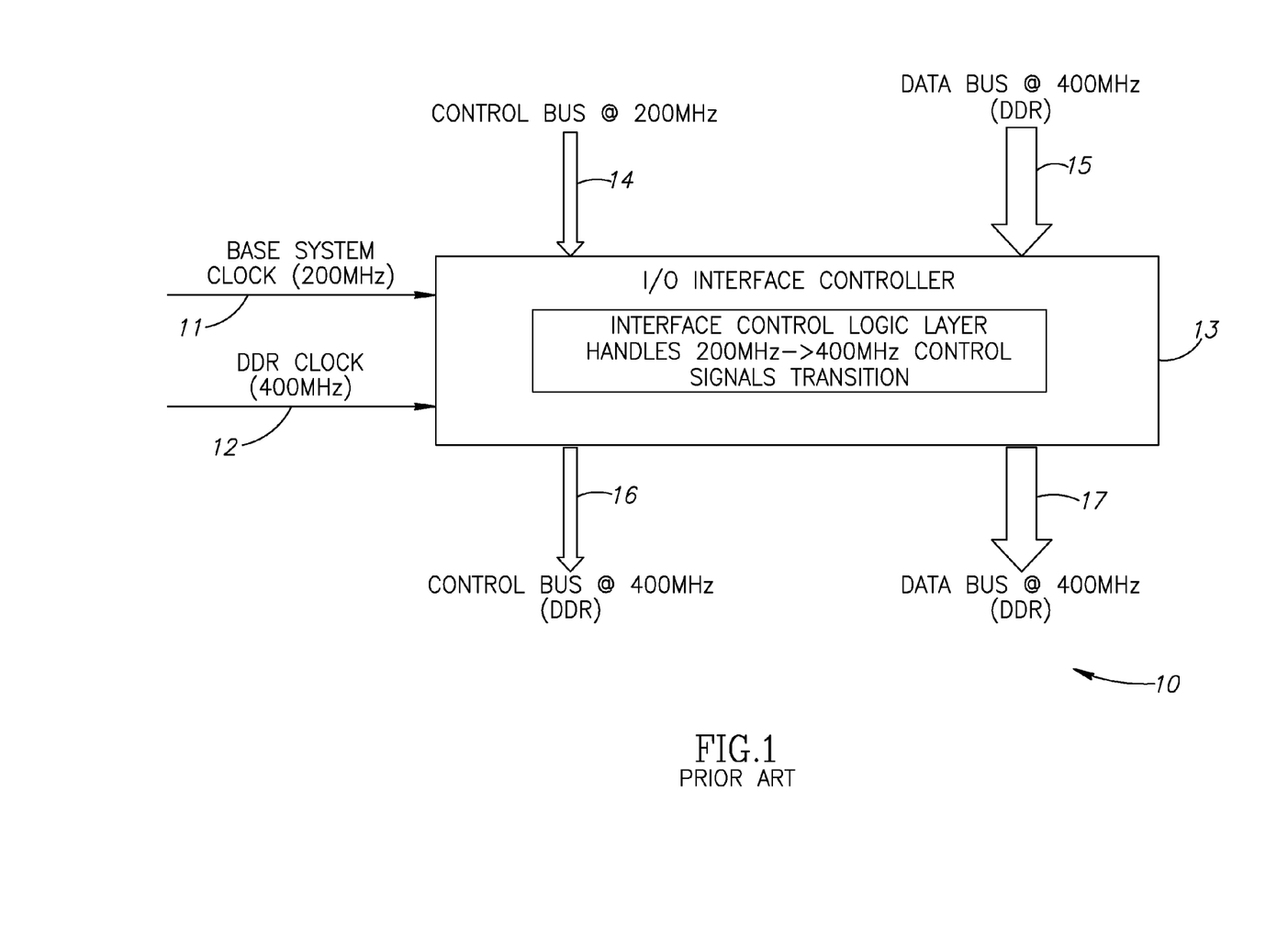
FIG. 1 is a block diagram of a system comprising two clock domains illustrating the prior art.

An example hardware design implementing prior art DDR transfer techniques is shown in FIG. 1, representing a system interconnect system comprising two separate interfaces for control and data. The block diagram, generally referenced 10, comprises base (i.e., slow non-DDR) 200 megahertz (MHz) system clock 11, fast 400 MHz system clock (DDR) 12, control bus signal input 14, data bus signal input 15, Input/Output (I/O) interface controller 13, control bus signal output 16 and data bus signal output 17. In this system, the control interface is timed by non-DDR 200 MHz clock 11 and the data interfaces is timed by DDR 400 MHz clock 12. Control bus signal input 14 is a 200 MHz signal and data bus signal 15 is a 400 MHz signal. I/O interface 13 is an I/O device interface with separate control and data buses, both operating in a single DDR clock domain.

In the design represented by block diagram 10, the logic in I/O interface controller 13 captures system interconnect data transfers going to an I/O device and forwards them to an I/O device interface. I/O interface controller 13 is also responsible to properly handle clock domain crossing (from DDR to non-DDR domain and back), in this case effecting the transition of the control bus signal from a 200 MHz (input) signal to a 400 MHz (output) signal. Note that both control bus signal output 16 and data bus signal output 17 from I/O interface controller 13 are 400 MHz (DDR) signals.

The fast DDR clock is usually used on the timing-critical logic segments and imposes significant challenges for chip layout and physical design. Therefore designs generally limit the DDR clock use as much as possible to simplify on chip layout in the non-critical areas. In these design implementations logic signals are sometimes transferred from the DDR logical domain into non-DDR domain and back.

The signals from the slow clock domain sampled by a fast clock must close fast clock domain timing, since the first DDR clock capture occurs on the falling edge of the slow launch clock. Such signals are automatically handled by the synthesis tools as DDR domain paths and require conservative (DDR domain) timing closure. If such a signal is a logic block input that cannot support conservative DDR timing, the signal must be first captured by a slow clock latch and then transferred to a fast clock domain, limiting the physical route between the domains. While functional zero-delay simulation will not report such clock domain crossing problem, synthesis timing closure will automatically apply conservative timing, potentially introducing timing violations in areas that were not designed for fast DDR clock timing. Incorrect crossing of clock domains from slow domain to fast domain may add a more restricted timing constraint, which is difficult (and sometimes impossible) to resolve. Since late slow signals are sampled by fast logic, the logic error cannot be detected in the design verification phase, and can only sometimes be detected in the final stages of the design synthesis phase.

Figure 2:
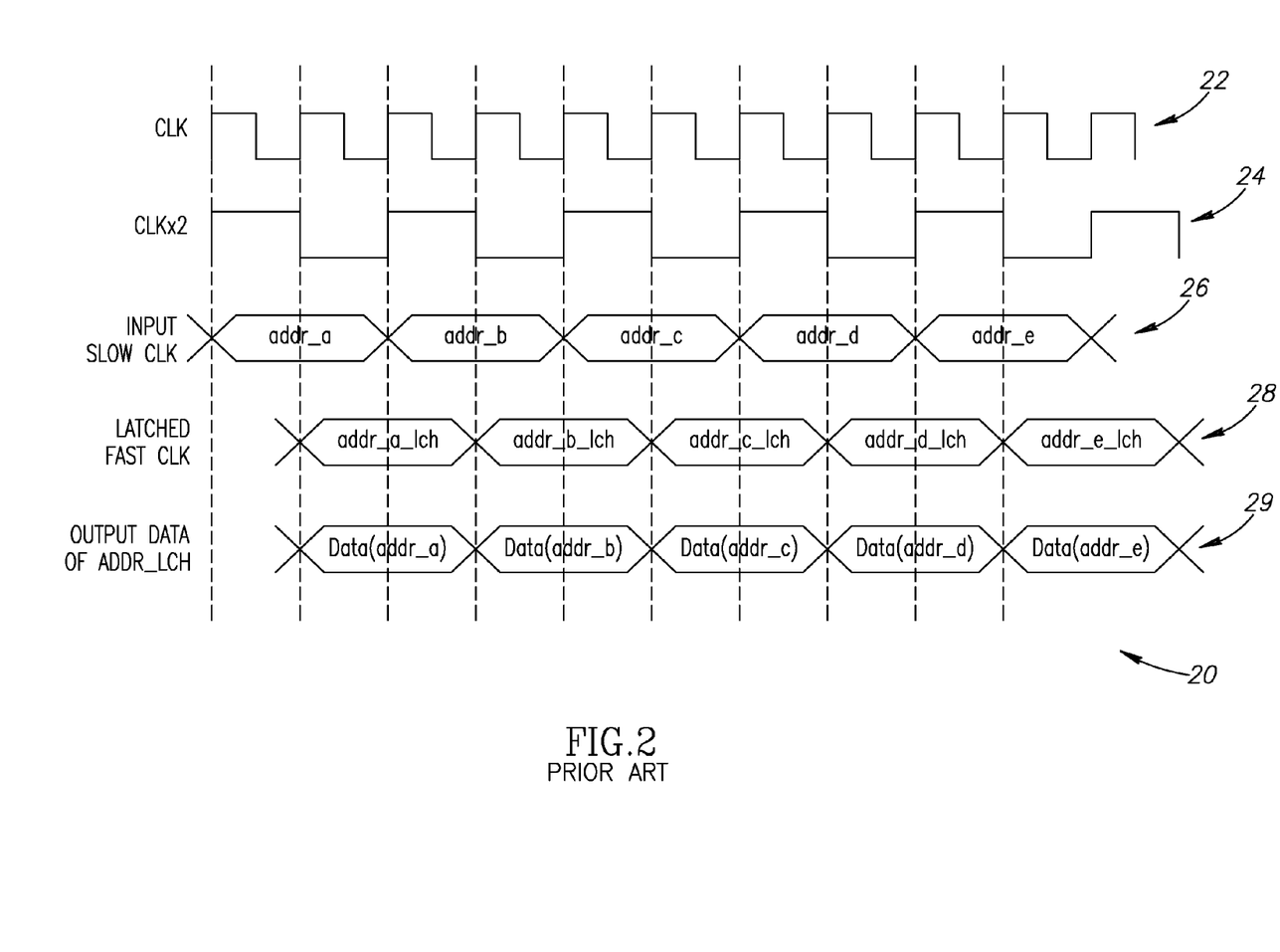
FIG. 2 is a timing diagram illustrating a system with a clock domain crossing violation not detectable by prior art verification methods.

An example of a timing diagram illustrating a system with a clock domain crossing violation is shown in FIG. 2. The diagram, generally referenced 20, comprises fast clock 22, slow clock 24, slow clock input signal 26, a signal indicating when the input signal is latched to the fast clock 28 and output data 29. In this timing diagram, fast clock 22 is twice the speed of slow clock 24. Input signal 26 comprises a series of memory addresses to be read. Signal 28 indicates when the fast clock is latching the slow clock input, and signal 29 comprises the data retrieved from the memory address referenced in input signal 26.

In a particular embodiment of the invention, the signal phase verification mechanism of the present invention enables zero-delay verification tools to detect clock domain crossing violations in device under test designs comprising two different clock domains where the fast clock is an integer multiple of the slow clock. In a particular embodiment of the present invention a mechanism is provided to insert undefined values on slow clock domain signals during the clock periods when the signals are not supposed to be captured. The undefined values are contained in the logic cone and emulate timing uncertainly of the path. Propagation of the undefined values through the capturing latch indicates improper clock domains crossing handling.

The signal phase verification mechanism of the present invention enables zero-delay verification tools to analyze systems comprising a slow clock domain driving a control path and a fast clock domain driving a data path, where the fast clock domain is an integer multiple of the slow clock domain. During the verification phase, a standard simulation is performed which receives the fast clock, the slow clock and a signal timed in the slow clock domain. The mechanism inserts undefined values into the signal at points where the signal is not supposed to be captured. If the signal is captured directly in the fast clock domain (i.e., not sampled first by the slow clock domain), then the undefined values propagate into the logic and result in simulation failure. If, however, the signal is properly sampled in the slow clock domain (i.e., before the fast clock domain), then the undefined values will not propagate, thereby hiding the undefined values from the rest of the logic.

In certain embodiments, the present invention can be incorporated into verification tools thereby enabling them to detect clock domain crossing violations in device under test designs comprising two different clock domains where the fast clock rate is an integer multiple of the slow clock rate. These clock domain crossing violations were previously unable to be identified using prior art verification tools, and could only be potentially identified during the subsequent synthesis phase.

Note that some embodiments of the invention described herein may be constructed as software objects that are executed in embedded devices as firmware, software objects that are executed as part of a software application on either an embedded or non-embedded computer system such as a digital signal processor (DSP), microcomputer, minicomputer, microprocessor, etc. running a real-time operating system such as WinCE, Symbian, OSE, Embedded LINUX, etc., or non-real time operating system such as Windows, UNIX, LINUX, etc., or as soft core realized HDL circuits embodied in an Application Specific Integrated Circuit (ASIC) or Field Programmable Gate Array (FPGA), or as functionally equivalent discrete hardware components.

There is thus provided in accordance with an embodiment of the invention, a method of inserting invalid values on a slow clock domain signal during fast clock domain periods when the signal is not to be captured, the method comprising the steps of dividing the slow clock domain into time units of the fast clock domain, determining the fast clock domain time unit within each slow clock domain time unit when the signal is to be read, assigning previously known valid values to the fast clock cycle time units in each the slow clock cycle time unit where the signal is to be read and assigning invalid values to all fast clock cycle time units in each the slow clock cycle time units when the signal is not to be read.

There is also provided in accordance with an embodiment of the invention, a method of verifying signal phases in a system wherein a slow clock domain drives a control path and a fast clock domain drives a data path, the method comprising the steps of creating a slow cook domain data signal comprising known valid values during clock periods when the slow clock domain data signal is to be read and comprising invalid values during clock periods when the slow clock domain data signal is not to be read and authenticating the slow domain data signal against the known valid values.

There is further provided in accordance with an embodiment of the invention, a computer program comprising a computer usable medium having computer usable program code for verifying signal phases in systems with a slow clock domain driving a control path and a fast clock domain driving a data path; the computer program product including computer usable program code for creating a slow clock domain data signal comprising known valid values during clock periods when the slow clock domain data signal is to be read and comprising invalid values during clock periods when the slow clock domain data signal is not to be read and computer usable program code for authenticating the slow domain data signal against the known valid values.

BRIEF DESCRIPTION OF THE DRAWINGS

The invention is herein described, by way of example only, with reference to the accompanying drawings, wherein.

DETAILED DESCRIPTION

Notation Used Throughout

The following notation is used throughout this document.

| Term | Definition |
| --- | --- |
| ASIC | Application Specific Integrated Circuit |
| CD-ROM | Compact Disc Read Only Memory |
| CPU | Central Processing Unit |
| DDR | Double Data Rate |
| DSP | Digital Signal Processor |
| EEROM | Electrically Erasable Read Only Memory |
| FPGA | Field Programmable Gate Array |
| FTP | File Transfer Protocol |
| HDL | Hardware Description Language |
| HTTP | Hyper-Text Transport Protocol |
| I/O | Input/Output |
| LAN | Local Area Network |
| MHz | Megahertz |
| NIC | Network Interface Card |
| RAM | Random Access Memory |
| ROM | Read Only Memory |
| WAN | Wide Area Network |

The signal phase verification mechanism of the present invention enables zero-delay verification tools to detect clock domain crossing violations in device under test designs comprising two different clock domains where the fast clock rate is an integer multiple of the slow clock rate. The present invention also provides a mechanism to insert undefined values on slow clock domain signals during the clock periods when the signals are not supposed to be captured. The undefined values are contained in the logic cone and emulate timing uncertainty of the path. Propagation of the undefined values through the capturing latch indicates improper clock domain crossing handling.

The signal phase verification mechanism of the present invention enables zero-delay verification tools to analyze systems comprising a slow clock domain driving a control path and a fast clock domain driving a data path, where the fast clock domain is an integer multiple of the slow clock domain. During the verification phase, a standard simulation is performed which receives the fast clock, the slow clock and a signal timed in the slow clock domain. The mechanism inserts undefined values into the signal at points where the signal is not supposed to be captured. If the signal is captured directly in the fast clock domain (i.e., not sampled first by the slow clock domain), then the undefined values propagate into the logic and result in simulation failure. If, however, the signal is properly sampled in the slow clock domain (i.e., before the fast clock domain), then the undefined values will not propagate, hiding the undefined values from the rest of the logic.

The present invention can be incorporated into verification tools thereby enabling them to detect clock domain crossing violation in device under test designs comprising two different clock domains where the fast clock is an integer multiple of the slow clock. These clock domain crossing violations were previously unable to be identified using prior art verification tools, and could only be potentially identified during the subsequent synthesis phase.

Some portions of the detailed descriptions which follow are presented in terms of procedures, logic blocks, processing, steps, and other symbolic representations of operations on data bits within a computer memory. These descriptions and representations are the means used by those skilled in the data processing arts to most effectively convey the substance of their work to others skilled in the art. A procedure, logic block, process, etc., is generally conceived to be a self-consistent sequence of steps or instructions leading to a desired result. The steps require physical manipulations of physical quantities. Usually, though not necessarily, these quantities take the form of electrical or magnetic signals capable of being stored, transferred, combined, compared and otherwise manipulated in a computer system. It has proven convenient at times, principally for reasons of common usage, to refer to these signals as bits, bytes, words, values, elements, symbols, characters, terms, numbers, or the like.

All of the above and similar terms are to be associated with the appropriate physical quantities they represent and are merely convenient labels applied to these quantities. Unless specifically stated otherwise as apparent from the following discussions, it is appreciated that throughout the present invention, discussions utilizing terms such as 'processing,' 'computing,' 'calculating,' 'determining,' 'displaying' or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Note that the invention can take the form of an entirely hardware embodiment, an entirely software/firmware embodiment or an embodiment containing both hardware and software/firmware elements. In a certain embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

Figure 3:
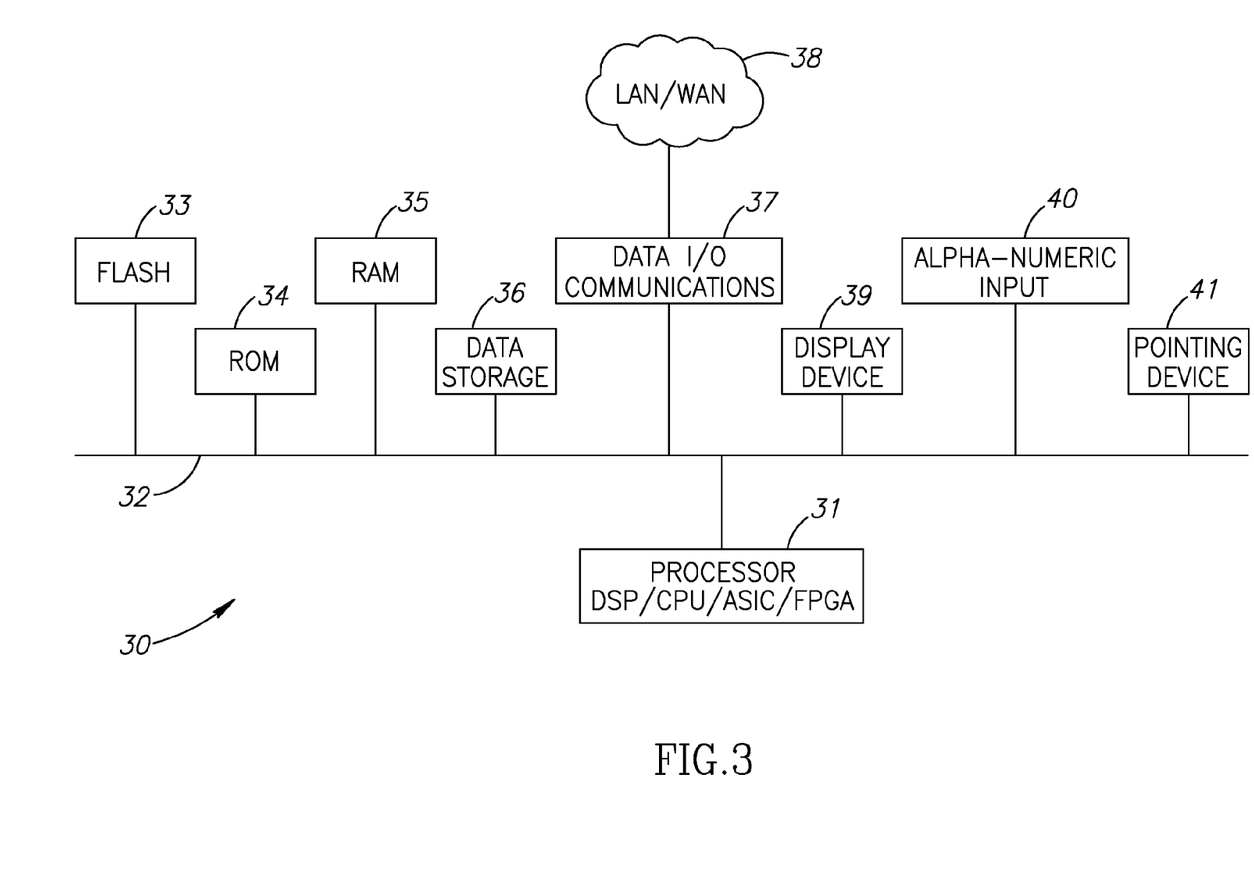
FIG. 3 is a block diagram illustrating an example computer processing system adapted to implement the clock domain crossing violation detection mechanism of the present invention.

A block diagram illustrating an example computer processing system adapted to implement the signal phase verification mechanism of the present invention is shown in FIG. 3. The computer system, generally referenced 30, comprises a processor 31 which may comprise a digital signal processor (DSP), central processing unit (CPU), microcontroller, microprocessor, microcomputer, ASIC or FPGA core. The system also comprises static read only memory 34 and dynamic main memory 35 all in communication with the processor. The processor is also in communication, via bus 32, with a number of peripheral devices that are also included in the computer system. Peripheral devices coupled to the bus include a display device 39 (e.g., monitor), alpha-numeric input device 40 (e.g., keyboard) and pointing device 41 (e.g., mouse, tablet, etc.)

The computer system is connected to one or more external networks such as a LAN or WAN 38 via communication lines connected to the system via data I/O communications interface 37 (e.g., network interface card or NIC). The network adapters 37 coupled to the system enable the data processing system to become coupled to other data processing systems or remote printers or storage devices through intervening private or public networks. Modems, cable modem and Ethernet cards are just a few of the currently available types of network adapters. The system also comprises magnetic or semiconductor based storage device 36 for storing application programs and data. The system comprises computer readable storage medium that may include any suitable memory means, including but not limited to, magnetic storage, optical storage, semiconductor volatile or non-volatile memory, biological memory devices, or any other memory storage device.

Software adapted to implement the signal phase verification mechanism of the present invention is adapted to reside on a computer readable medium, such as a magnetic disk within a disk drive unit. Alternatively, the computer readable medium may comprise a floppy disk, removable hard disk, Flash memory 33, EEROM based memory, bubble memory storage, ROM storage, distribution media, intermediate storage media, execution memory of a computer, and any other medium or device capable of storing for later reading by a computer a computer program implementing the method of this invention. The software adapted to implement the signal phase verification mechanism of the present invention may also reside, in whole or in part, in the static or dynamic main memories or in firmware within the processor of the computer system (i.e., within microcontroller, microprocessor or microcomputer internal memory).

Other digital computer system configurations can also be employed to implement the signal phase verification mechanism of the present invention, and to the extent that a particular system configuration is capable of implementing the system and methods of this invention, it is equivalent to the representative digital computer system of FIG. 3 and within the spirit and scope of this invention.

Once they are programmed to perform particular functions pursuant to instructions from program software that implements the system and methods of this invention, such digital computer systems in effect become special purpose computers particular to the method of this invention. The techniques necessary for this are well-known to those skilled in the art of computer systems.

It is noted that computer programs implementing the system and methods of this invention will commonly be distributed to users on a distribution medium such as floppy disk or CD-ROM or may be downloaded over a network such as the Internet using FTP, HTTP, or other suitable protocols. From there, they will often be copied to a hard disk or a similar intermediate storage medium. When the programs are to be run, they will be loaded either from their distribution medium or their intermediate storage medium into the execution memory of the computer, configuring the computer to act in accordance with the method of this invention. All these operations are well-known to those skilled in the art of computer systems.

Detecting Clock Domain Crossing Violations

In operation, the invention enables detection of clock domain crossing violations by detecting any sampling of slow logic by fast logic during the verification phase of the device under test. The present invention inserts undefined values on involved slow clock domain signals during the clock periods when the signals are not supposed to be captured by the device under test. The undefined values are supposed to be contained in the logic cone and emulate timing uncertainty of the path. Propagation of the undefined values through the capturing latch suggests improper clock domains crossing handling.

Figure 4:
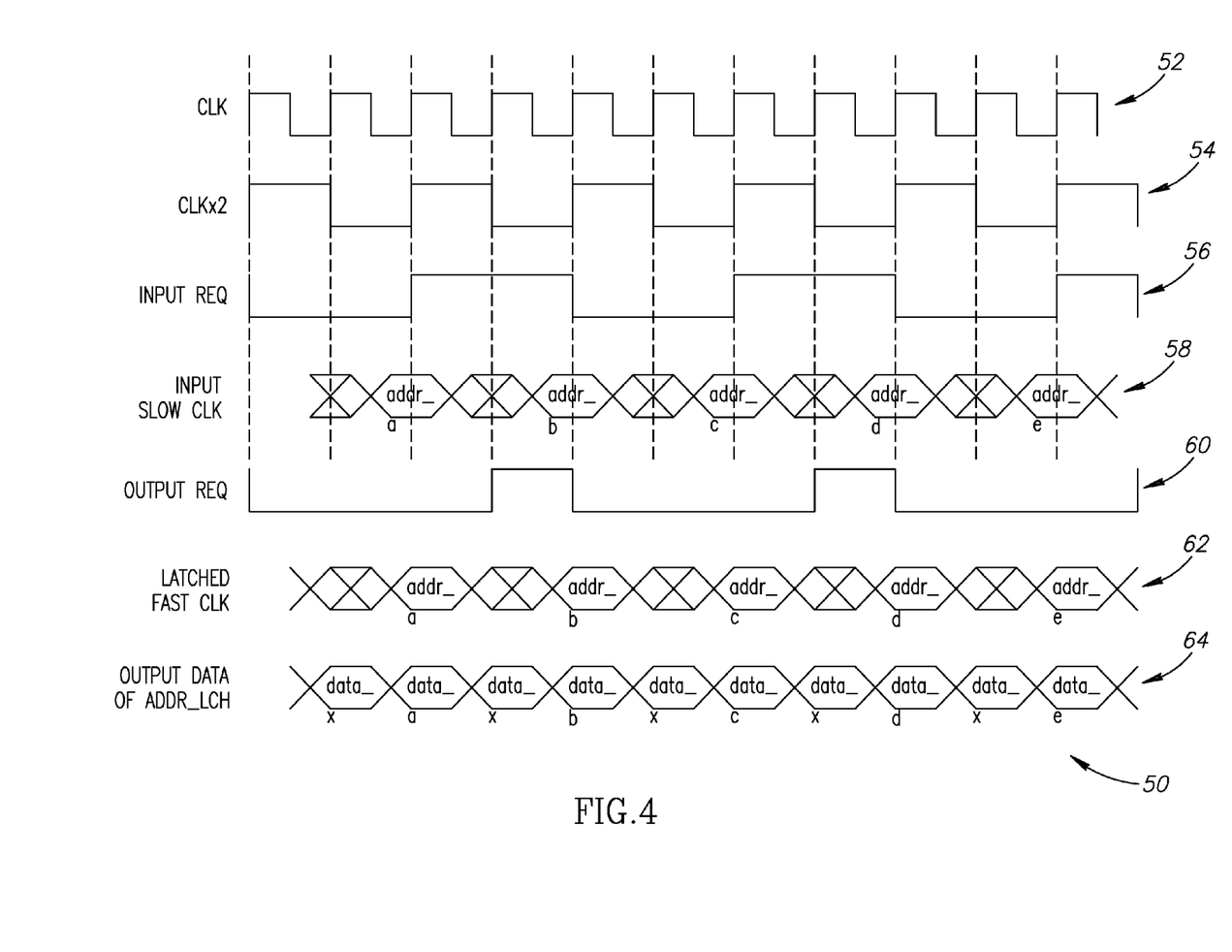
FIG. 4 is timing diagram illustrating a system with a clock domain crossing violation that is detected by the clock domain detection method of the present invention.

A timing diagram illustrating the detection of a clock domain crossing violation using the method of the present invention is shown in FIG. 4. The timing diagram, generally referenced 50, comprises slow clock signal 52, fast clock signal 54, input request signal 56, slow clock input signal 58, output request signal 60, a signal indicating when the input signal is latched to the fast clock 62, and retrieved data 64. For the device under test of the current example, input signal 58 is supposed to be sampled at the fast clock cycle corresponding to the rising edge of the slow clock cycle. Therefore, random values (represented by "X" in the signal) are inserted in input signal 58 during the fast clock cycle corresponding to the falling edge of the slow clock cycle and valid data (in this case addresses) are inserted into input signal 58 at the fast clock cycle corresponding to the rising edge of the slow clock signal.

In the design of this device under test, input request signal 56 is correctly latched to the fast clock cycle time unit corresponding to the rising edge of the slow clock and output signal 60 is latched to the fast clock time unit corresponding to the falling edge of the slow clock cycle (i.e., one fast clock cycle too early). Therefore, the data latched to the fast clock cycle time unit at that point is not valid per the method described supra. The random data read will result in non-valid retrieved data 64 indicating that there exists a clock domain crossing violation.

Figure 5:
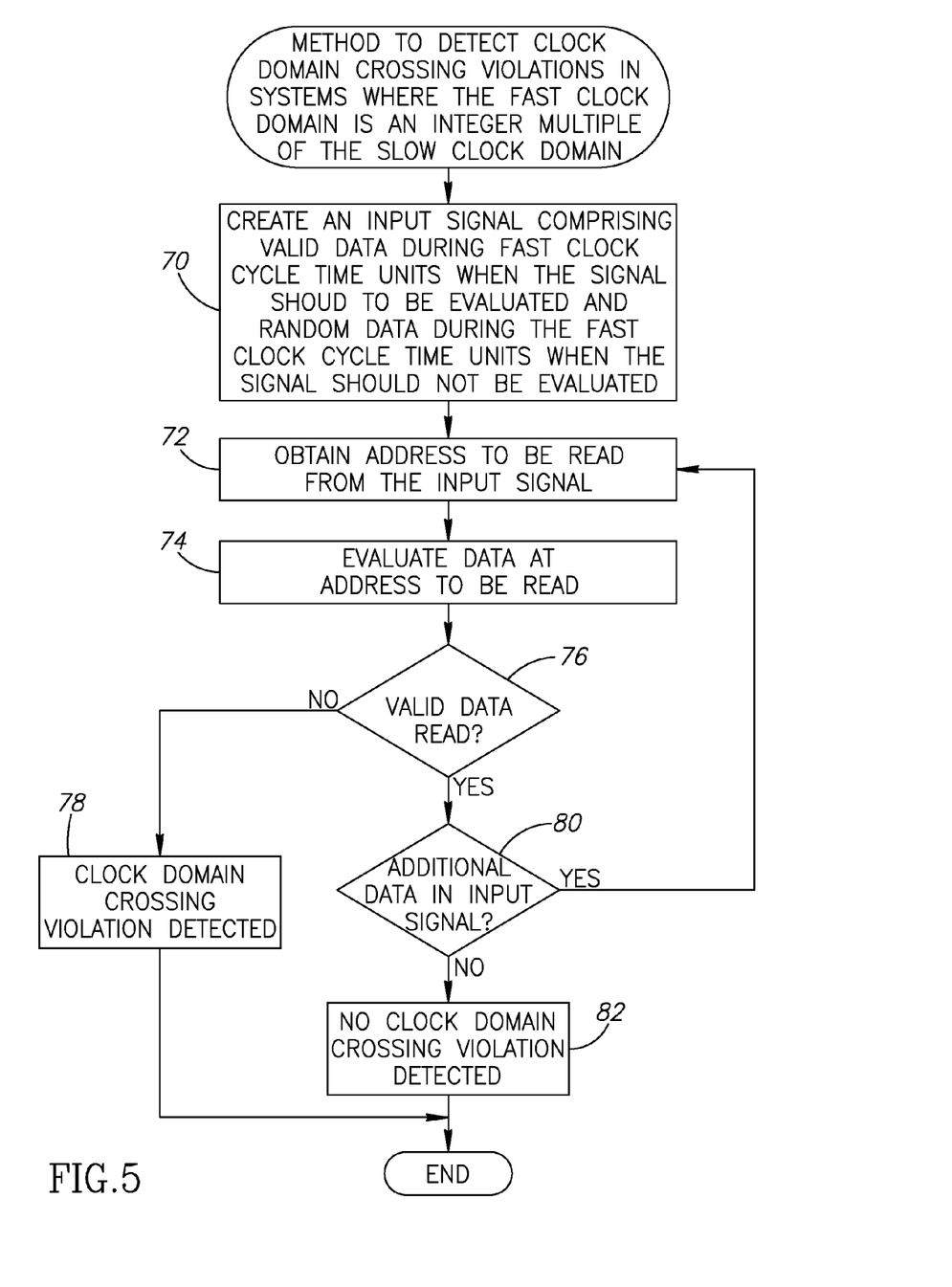
FIG. 5 is a flow diagram illustrating the clock domain crossing violation detection of the present invention.

A flow diagram illustrating the clock domain crossing violation detection method of the present invention is shown in FIG. 5. First an input signal is created which comprises valid data during fast clock time units when the input signal is supposed to be read and random (i.e., invalid) data during fast clock time units when the input signal is not supposed to be read (step 70). The device under test obtains an address to be read (step 72). The data at the address obtained during step 72 is then evaluated (step 74). If the data read is not valid (step 76) then a clock domain crossing violation exists (step 78) and the analysis is terminated. If the data read in step 74 is valid then there was no clock domain crossing violation (for the data read). If there is additional data in the input signal (step 80) then further analysis is required and the method returns to step 72. Otherwise no clock domain crossing violation was detected (step 82) and the analysis is terminated.

Figure 6:
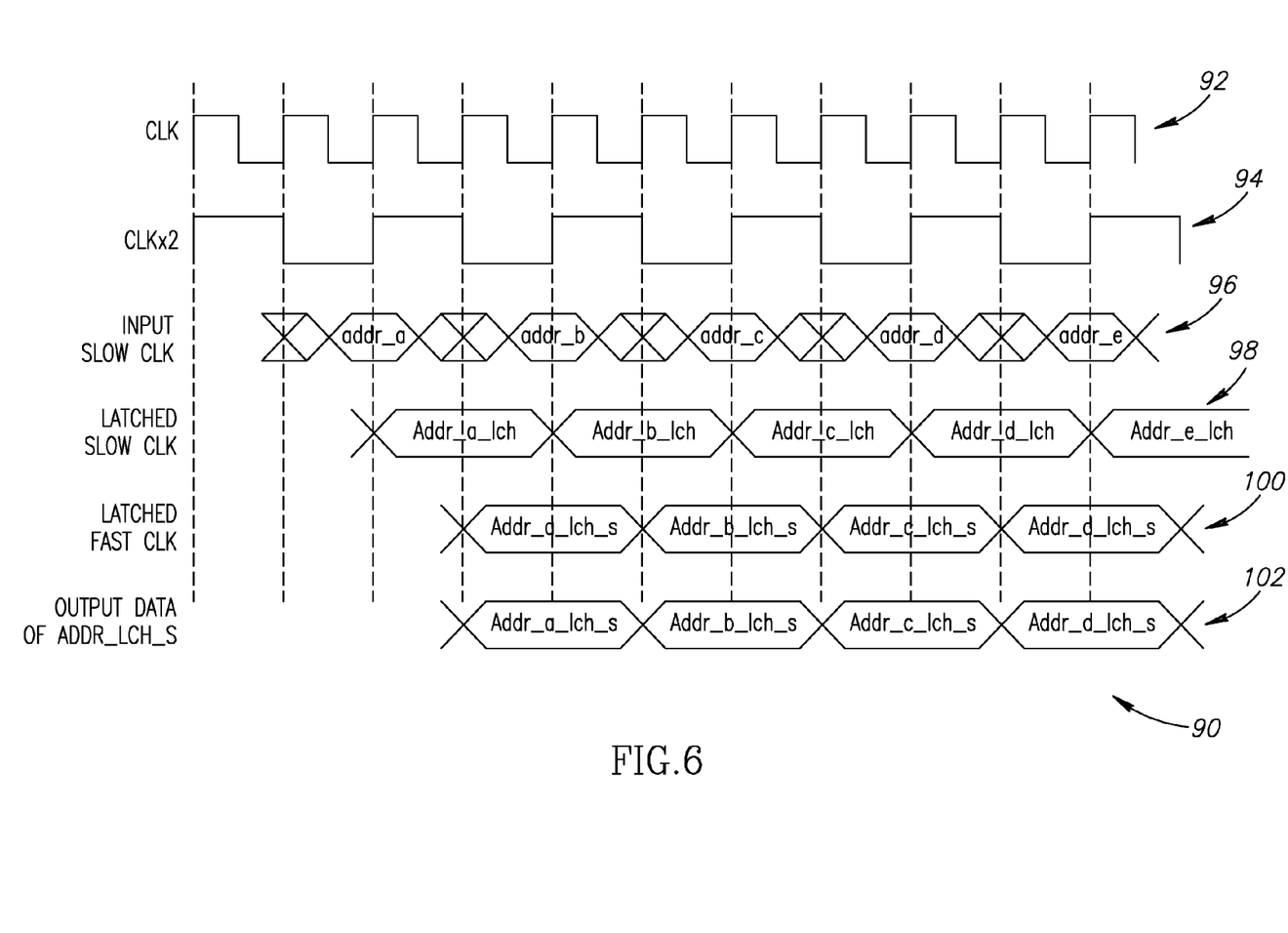
FIG. 6 is a timing diagram illustrating a system with no clock domain crossing violation.

A timing diagram illustrating no clock domain crossing violation is shown in FIG. 6. The timing diagram, generally referenced 90 comprises fast clock signal 92, slow clock signal 94, input signal 96, input signal latched to the slow clock 98, input signal latched to the fast clock 100 and output signal 102. In accordance with the present invention, input signal 96 comprises valid data (in this case, addresses) during fast clock cycle time units when the signal is supposed to be captured by the device under test, and random (i.e., invalid) data during the remaining fast clock cycle time units. In this timing diagram, input signal 96 is sampled via the slow clock (signal 92) at the rising edge of the slow clock. The fast clock correctly latches the input signal (signal 98), also at the fast clock cycle time unit corresponding to the subsequent rising edge of the slow clock. Since no clock domain crossing violation exists, valid addresses are read from input signal 96 which results in valid data being observed in output signal 102.

The timing diagrams discussed supra assumes that all the signals are timed by the rising edge of the clock. A similar technique with a few adaptations can be implemented in systems driven by a falling edge of the clock.

Inserting Random Data Into a Slow Clock Domain Signal

The mechanism of the present invention generates an input signal for the device under test using time units of the fast clock. Valid data values (e.g., "1", "0", "X") are inserted into the signal during time units that the signal is supposed to be captured by the device under test. Random (i.e., undefined and therefore invalid) data values are inserted in the signal during time units when the signal is not supposed to be captured.

Figure 7A:
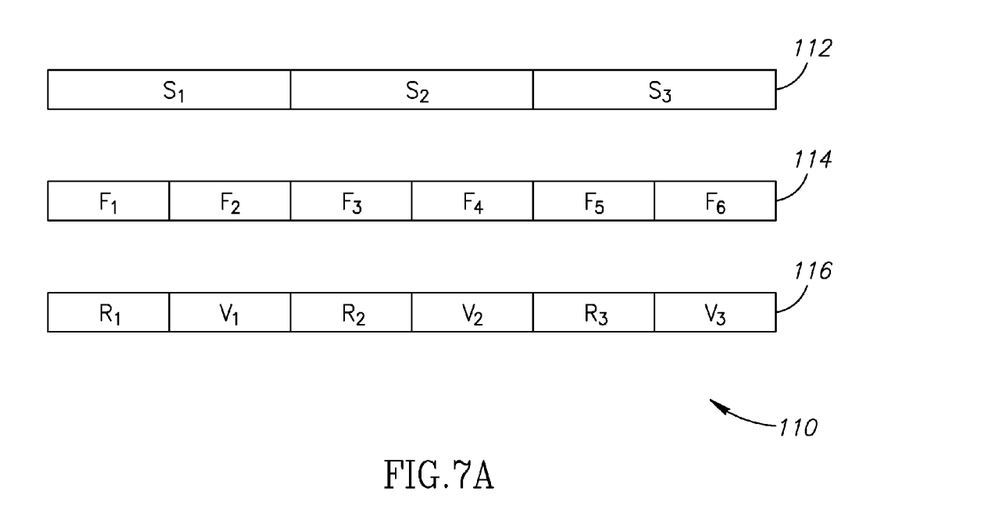
FIG. 7A is a block diagram illustrating a slow clock domain input signal where the fast clock is twice the speed of the slow clock using the random data insertion method of the present invention.
Figure 7B:
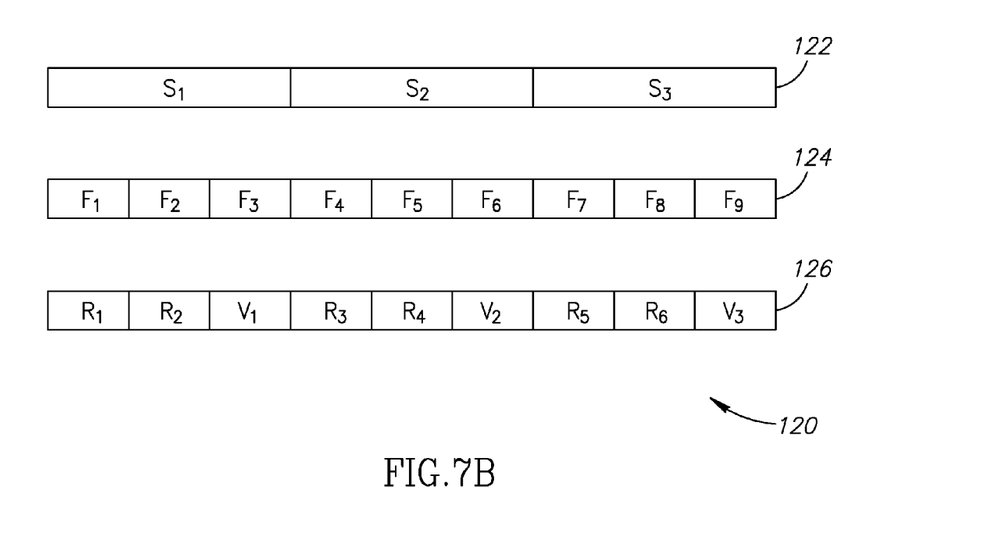
FIG. 7B is a block diagram illustrating a slow clock domain input signal where the fast clock is three times the speed of the slow clock using the random data insertion method of the present invention.

FIGS. 7A and 7B show examples of input data signals created using the method of the present invention. In both these examples the device under test is designed to capture the input signal during the final fast clock cycle time unit within each slow clock cycle time unit. FIG. 7A shows an input signal where the fast clock is twice the speed of the slow clock. The block diagram, generally referenced 110, comprises slow clock cycle 112, fast clock time cycle 114 and input signal 116. Fast clock 114 contains two time units ($F_1$, $F_2$, $F_3$, $F_4$, $F_5$, $F_6$) for each time unit of slow clock 112 ($S_1$, $S_2$, $S_3$). Input signal 116 is comprised of random (i.e., undefined) values ($R_1$, $R_2$, $R_3$) which correspond to the first fast clock time unit ($F_1$, $F_3$, $F_5$) of each slow clock time unit and valid values ($V_1$, $V_2$, $V_3$) corresponding to the last fast clock time unit of each slow clock time unit ($F_2$, $F_4$, $F_6$).

FIG. 7B shows an example of an input signal using the method of the present invention where the fast clock is three times the speed of the slow clock and the device under test is designed to capture the input signal during the final fast clock cycle of each slow clock cycle. The block diagram, generally referenced 120 comprises slow clock 122, fast clock 124 and input signal 126. Fast clock 124 contains two time units ($F_1$, $F_2$, $F_3$, $F_4$, $F_5$, $F_6$, $F_7$, $F_8$, $F_9$) for each time unit of slow clock 122 ($S_1$, $S_2$, $S_3$). Input signal 126 is comprised of random (i.e., undefined) values ($R_1$, $R_2$, $R_3$, $R_4$, $R_5$, $R_6$) which correspond to the first two fast clock time unit ($F_1$, $F_2$, $F_3$, $F_4$, $F_5$, $F_6$) of each slow clock time unit and valid values ($V_1$, $V_2$, $V_3$) corresponding to the last fast clock time unit of each slow clock time unit ($F_3$, $F_6$, $F_9$).

Figure 8:
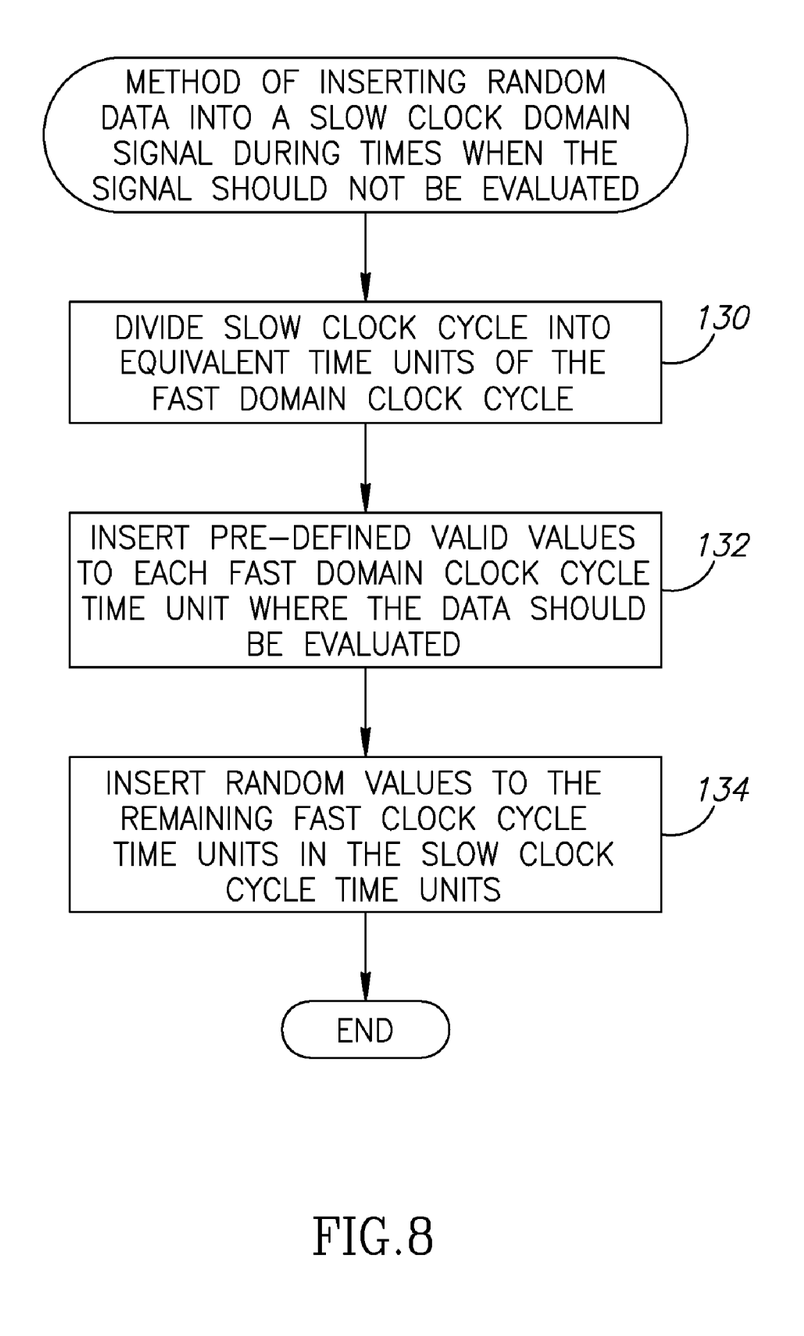
FIG. 8 is a flow diagram illustrating the method of inserting random data into a slow clock domain input signal used in the present invention.

A flow diagram illustrating the method of inserting random data into a slow clock domain signal is shown in FIG. 8. First, the slow clock cycle is divided into equivalent time units of the fast domain clock cycle (step 130). Predefined (i.e., valid) values are then inserted into the fast clock cycle time units when the signal is supposed to be captured by the device under test (step 132). Finally, undefined (in this case random) values are assigned to the fast clock cycle time units where the signal is not supposed to be evaluated by the device under test (step 134).

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A method of inserting invalid values on a slow clock domain signal during fast clock domain periods when said signal is not to be captured, said method comprising the steps of:

dividing said slow clock domain into time units of said fast clock domain;

determining the fast clock domain time unit within each slow clock domain time unit when said signal is to be read;

assigning previously known valid values to said fast clock cycle time units in each said slow clock cycle time unit where said signal is to be read; and assigning invalid values to all fast clock cycle time units in each said slow clock cycle time units when said signal is not to be read.

2. The method according to claim 1, wherein said fast clock domain is an integer multiple of said slow clock domain.

3. A method of verifying signal phases in a system wherein a slow clock domain drives a control path and a fast clock domain drives a data path, said method comprising the steps of:
- creating a slow clock domain data signal comprising known valid values during clock periods when said slow clock domain data signal is to be read and comprising invalid values during clock periods when said slow clock domain data signal is not to be read, wherein creating a slow clock domain data signal comprises:
  - dividing said slow clock domain into time units of said fast clock domain;
  - determining the fast clock domain time unit within each slow clock domain time unit when said signal is to be read;
  - assigning valid values to said fast clock cycle time unit in each said slow clock cycle time unit when said signal is to be read;
  - assigning invalid values to all fast clock cycle time units in each said slow clock cycle time units when said signal is not to be read; and
- authenticating said slow domain data signal against said known valid values.

4. The method according to claim 3, wherein said fast clock domain is an integer multiple of said slow clock domain.

5. The method according to claim 3, wherein there is zero delay between said fast clock domain and said slow clock domain.

6. The method according to claim 3, wherein said invalid values do not propagate down said data path if said slow clock domain data signal is properly sampled in said slow clock domain.

7. The method according to claim 3, wherein said invalid values comprises random values.

8. The method according to claim 3, wherein said step of authenticating said slow domain data signal comprises the steps of:
- acquiring address data from said fast clock domain data signal indicating an address to be read;
- evaluating data from said address to be read; and
- comparing said data from said address to be read against said known valid values.

9. The method according to claim 8, wherein said data from said address to be read matching any said known valid values indicates proper handling of crossing clock domains.

10. The method according to claim 8, wherein said data from said address to be read not matching any said known valid values indicates improper handling of crossing clock domains.

11. The method according to claim 8, wherein said steps of acquiring, evaluating and comparing are repeated one or more times if there is still data in said data signal that has not yet been read.

12. A computer program product comprising:
- a non-transitory computer usable medium having computer usable program code for verifying signal phases in systems with a slow clock domain driving a control path and a fast clock domain driving a data path; said computer program product including:
  - computer usable program code for creating a slow clock domain data signal comprising known valid values during clock periods when said slow clock domain data signal is to be read and comprising invalid values during clock periods when said slow clock domain data signal is not to be read, wherein computer usable program code for creating a slow clock domain data signal comprises:
    - computer usable program code for dividing said slow clock domain into time units of said fast clock domain;
    - computer usable program code for determining the fast clock domain time unit within each slow clock domain time unit when said signal is to be read;
    - computer usable program code for assigning valid values to said fast clock cycle time unit in each said slow clock cycle time unit when said signal is to be read;
    - computer usable program code for assigning invalid values to all fast clock cycle time units in each said slow clock cycle time units when said signal is not to be read; and
  - computer usable program code for authenticating said slow domain data signal against said known valid values.

13. The computer program product according to claim 12, wherein said fast clock domain is an integer multiple of said slow clock domain.

14. The computer program product according to claim 12, wherein there is zero delay between said fast clock domain and said slow clock domain.

15. The computer program product according to claim 12, wherein said invalid values do not propagate down said data path if said slow clock domain data signal is properly sampled in said slow clock domain.

16. The computer program product according to claim 12, wherein said invalid values comprises random values.

17. The computer program product according to claim 12, wherein said step of authenticating said slow domain data signal comprises the steps of:
- acquiring address data from said fast clock domain data signal indicating an address to be read;
- evaluating data from said address to be read; and
- comparing said data from said address to be read against said known valid values.

18. The computer program product according to claim 17, wherein said data from said address to be read matching any said known valid values indicates proper handling of crossing clock domains.

19. The computer program product according to claim 17, wherein said data from said address to be read not matching any said known valid values indicates improper handling of crossing clock domains.

20. The computer program product according to claim 17, wherein said steps of acquiring, evaluating and comparing are repeated one or more times if there is still data in said data signal that has not yet been read.

* * * * *